US008117369B2

(12) United States Patent
Nishtala et al.

(10) Patent No.: US 8,117,369 B2
(45) Date of Patent: *Feb. 14, 2012

(54) INPUT-OUTPUT MODULE FOR OPERATION IN MEMORY MODULE SOCKET AND METHOD FOR EXTENDING A MEMORY INTERFACE FOR INPUT-OUTPUT OPERATIONS

(75) Inventors: Satyanarayana Nishtala, Cupertino, CA (US); Thomas Lee Lyon, Palo Alto, CA (US); Daniel Edward Lenoski, Monte Sereno, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/986,104

(22) Filed: Jan. 6, 2011

(65) Prior Publication Data

US 2011/0099317 A1 Apr. 28, 2011

Related U.S. Application Data

(63) Continuation of application No. 12/206,501, filed on Sep. 8, 2008, now Pat. No. 7,886,103.

(51) Int. Cl.
  *G06F 13/00* (2006.01)
  *H05K 7/10* (2006.01)
(52) U.S. Cl. ............. 710/301; 710/10; 710/16; 711/170
(58) Field of Classification Search .................... 710/10, 710/12, 16, 19, 62–64, 104, 301; 711/170
See application file for complete search history.

(56) References Cited

U.S. PATENT DOCUMENTS

| 5,995,405 | A | * | 11/1999 | Trick | 365/63 |
| 6,092,146 | A | * | 7/2000 | Dell et al. | 711/5 |
| 6,108,730 | A | * | 8/2000 | Dell et al. | 710/301 |
| 6,530,001 | B1 | * | 3/2003 | Lee | 711/154 |
| 7,152,143 | B2 | * | 12/2006 | Stubbs et al. | 711/115 |
| 7,197,575 | B2 | * | 3/2007 | Huppenthal et al. | 709/250 |

(Continued)

FOREIGN PATENT DOCUMENTS

WO  WO-2010028381 A1  3/2010

OTHER PUBLICATIONS

U.S. Appl. No. 12/206,501 Notice of Allowance mailed Sep. 29, 2010, 9 pgs.

(Continued)

*Primary Examiner* — Khanh Dang
(74) *Attorney, Agent, or Firm* — Schwegman, Lundberg & Woessner, P.A.

(57) ABSTRACT

An I/O module configured to operate in a memory module socket and method for extending a memory interface are generally described herein. The I/O module may include a serial-presence detection (SPD) device to indicate that the I/O module is an I/O device and to indicate one or more functions associated with the I/O module. The I/O module may also include a serial data controller to communicate serial data in accordance with a predetermined communication technique with a configurable switch of a host system over preselected system management (SM) bus address lines and unused system clock signal lines of the memory module socket. The predetermined communication technique may include a peripheral component interconnect express (PCIe), a Serial Advanced Technology Attachment (SATA), a Serial Attached Small Computer System Interface (SAS), a universal-serial bus (USB) or a switched-fabric (InfiniBand) communication technique.

18 Claims, 4 Drawing Sheets

I/O MODULE WITH STORAGE FUNCTIONALITY

U.S. PATENT DOCUMENTS

| | | | |
|---|---|---|---|
| 7,353,372 B2* | 4/2008 | Janus et al. | 713/1 |
| 7,373,440 B2* | 5/2008 | Huppenthal et al. | 710/72 |
| 7,680,968 B2* | 3/2010 | Burton | 710/62 |
| 7,788,421 B1* | 8/2010 | Heath et al. | 710/15 |
| 2002/0016897 A1* | 2/2002 | Nerl | 711/170 |
| 2003/0110368 A1* | 6/2003 | Kartoz | 713/1 |
| 2004/0103234 A1 | 5/2004 | Zer et al. | |
| 2005/0138267 A1* | 6/2005 | Bains et al. | 711/100 |
| 2006/0062047 A1 | 3/2006 | Bhakta et al. | |
| 2006/0206673 A1* | 9/2006 | Lu et al. | 711/154 |
| 2006/0236027 A1* | 10/2006 | Jain et al. | 711/106 |
| 2007/0220228 A1* | 9/2007 | Huang | 711/170 |
| 2010/0064099 A1 | 3/2010 | Nishtala et al. | |

OTHER PUBLICATIONS

International Application No. PCT/US2009/056251, Search Report mailed Feb. 1, 2010, 6 pgs.

International Application No. PCT/US2009/056251, Written Opinion mailed Feb. 1, 2010, 5 pgs.

* cited by examiner

I/O MODULE WITH STORAGE FUNCTIONALITY

FIG. 1

I/O MODULE WITH PROCESSING FUNCTIONALITY

INPUT-OUTPUT MODULE FOR OPERATION IN MEMORY MODULE SOCKET AND METHOD FOR EXTENDING A MEMORY INTERFACE FOR INPUT-OUTPUT OPERATIONS

CLAIM OF PRIORITY

This application is a continuation of U.S. patent application Ser. No. 12/206,501, filed on Sep. 8, 2008, which is incorporated herein by reference in its entirety.

TECHNICAL FIELD

Some embodiments pertain to processing platforms and input-output (I/O) operations. Some embodiments pertain to processing platforms that use memory modules, such as dual in-line memory modules (DIMMs).

BACKGROUND

Many conventional processing platforms, including desktop and server platforms, have a need for increased I/O functionality. The ability to expand the I/O functionality of a platform is limited due to the compartmentalization of the memory, I/O and storage. For example, memory may be generally compartmentalized in memory modules (e.g., DIMMs), I/O may be compartmentalized in peripheral component interconnect (PCI) devices, and storage may be compartmentalized in either hard disks or solid state storage devices.

DESCRIPTION OF EXAMPLE EMBODIMENTS

Overview

In some embodiments, an input-output (I/O) module is configured to operate in a memory module socket. The I/O module may include a serial-presence detection (SPD) device to indicate that the I/O module is an I/O device and to indicate one or more functions associated with the I/O module. The I/O module may also include a serial data controller to communicate serial data with a configurable switch of a host system over preselected system management (SM) bus address lines and unused system clock signal lines of the memory module socket. The I/O module may also include a clock generator to provide a clock signal to the serial data controller for use in communicating the serial data. The I/O module may also include an SM bus I/O device to interface with an SM bus channel of the host system to configure the clock generator for serial data communication.

Example Embodiments

The following description and the drawings sufficiently illustrate specific embodiments to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments set forth in the claims encompass all available equivalents of those claims.

Figure 1:
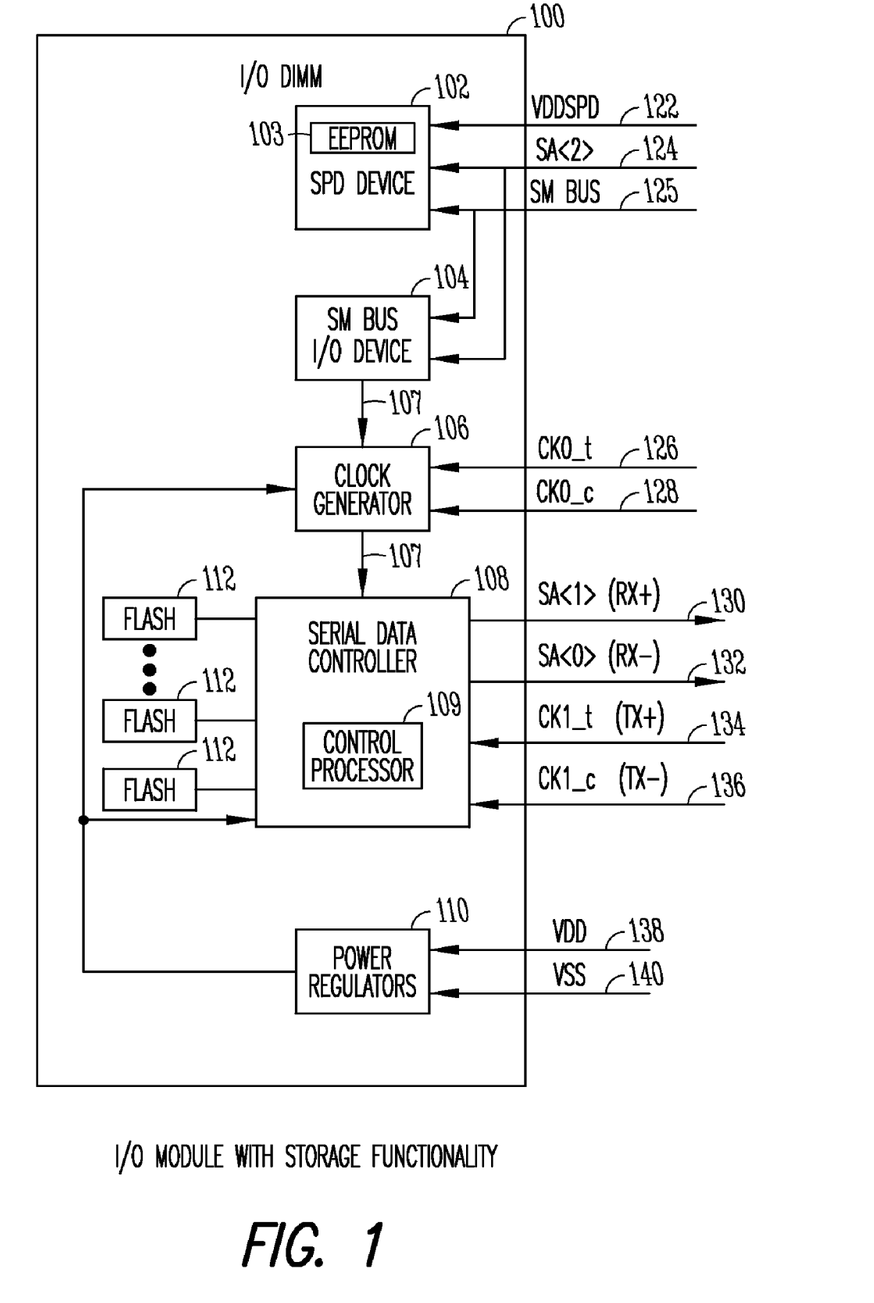
FIG. 1 is a functional block diagram of an I/O module with storage functionality in accordance with some embodiments.

FIG. 1 is a functional block diagram of an I/O module with storage functionality in accordance with some embodiments. I/O module 100 provides I/O functionality and may be configured to operate in a memory module socket of a processing platform or a host system. I/O module 100 may include serial-presence detection (SPD) device 102, system management (SM) bus I/O device 104, clock generator 106, serial data controller 108, and power regulators 110. SPD device 102 may indicate that I/O module 100 is an I/O device, rather than a memory device. SPD device 102 may also indicate one or more functions associated with I/O module 100. Serial data controller 108 may be configured to communicate serial data with a host system over preselected system management bus address (SA) lines 130 and 132 and unused system clock signal lines 134 and 136 of the memory module socket. Clock generator 106 may provide clock signal 107 to serial data controller 108 for use in communicating the serial data. SM bus I/O device 104 may interface with SM bus channel 125 of a host system to configure clock generator 106 for serial data communication.

In some embodiments, the host system may include a plurality of memory module sockets and may be configured to accept either I/O modules, such as I/O module 100, or memory modules, such as a memory DIMM, in the memory module sockets. In these embodiments, the host system may be configured to read the SPD devices of the modules present in the memory module sockets to determine whether each module present is an I/O module or a memory module. The use of one or more I/O modules 100 in a host system may add I/O functionality to the host system. This is discussed in more detail below.

In some embodiments, the host system reads SPD device 102 over SM bus channel 125 when the host system is powered or booted up and applies source power (VDDSPD) 122. In these embodiments, SPD device 102 may be addressed over SM bus address line 124. Clock generator 106 may either self-generate clock signal 107 using a local clock generator or may derive clock signal 107 from system clock signals 126 (CK0_t) and 128 (CK0_c). Power regulators 110 may provide power to serial data controller 108 and clock generator 106 from voltage signals 138 (VDD) and 140 (VSS) provided by the host system. Voltage signals 138 and 140 may be conventionally provided to a memory DIMM socket and may be available for use by power regulators 110. In some embodiments, power regulators 110 may be configured to either step up or step down these input voltages depending on what is needed by the elements of I/O module 100.

SPD device 102 may include serial non-volatile memory element 103 to store an indication that I/O module 100 is an I/O device rather than a memory device. Serial non-volatile memory element 103 may also store an indication of the one or more functions associated with I/O module 100. Serial non-volatile memory element 103 may be read by a host system over one of the SM bus channels, such as SM bus channel 125 (e.g., SM bus <0>) of the host's SM bus. This is discussed in more detail below. Serial non-volatile memory element 103 may be a serial Electrically Erasable Programmable Read-Only Memory (EEPROM), although the scope of the embodiments is not limited in this respect as other types of non-volatile memory elements may be used.

As mentioned above, I/O module 100 may provide one or more functions. The functions may include, for example, information storage and/or information processing functionality. I/O module 100 illustrated in FIG. 1 is an example of an I/O module with information storage functionality and includes non-volatile memory such as flash memory devices (FLASH) 112. When I/O module 100 includes information storage functionality, SPD device 102 may include an indication that I/O module 100 includes information storage functionality. Flash memory devices 112 may be configured to store serial data received through serial data controller 108. The use flash memory devices 112 or other non-volatile memory in I/O module 100, rather than DRAM which is used in a memory DIMM, may provide a significantly larger storage capacity and may be accessed quickly in a serial manner through serial data controller 108. In some embodiments, serial data controller 108 may include control processor 109, which may be configured to control the serial data communications of I/O module 100.

Figure 2:
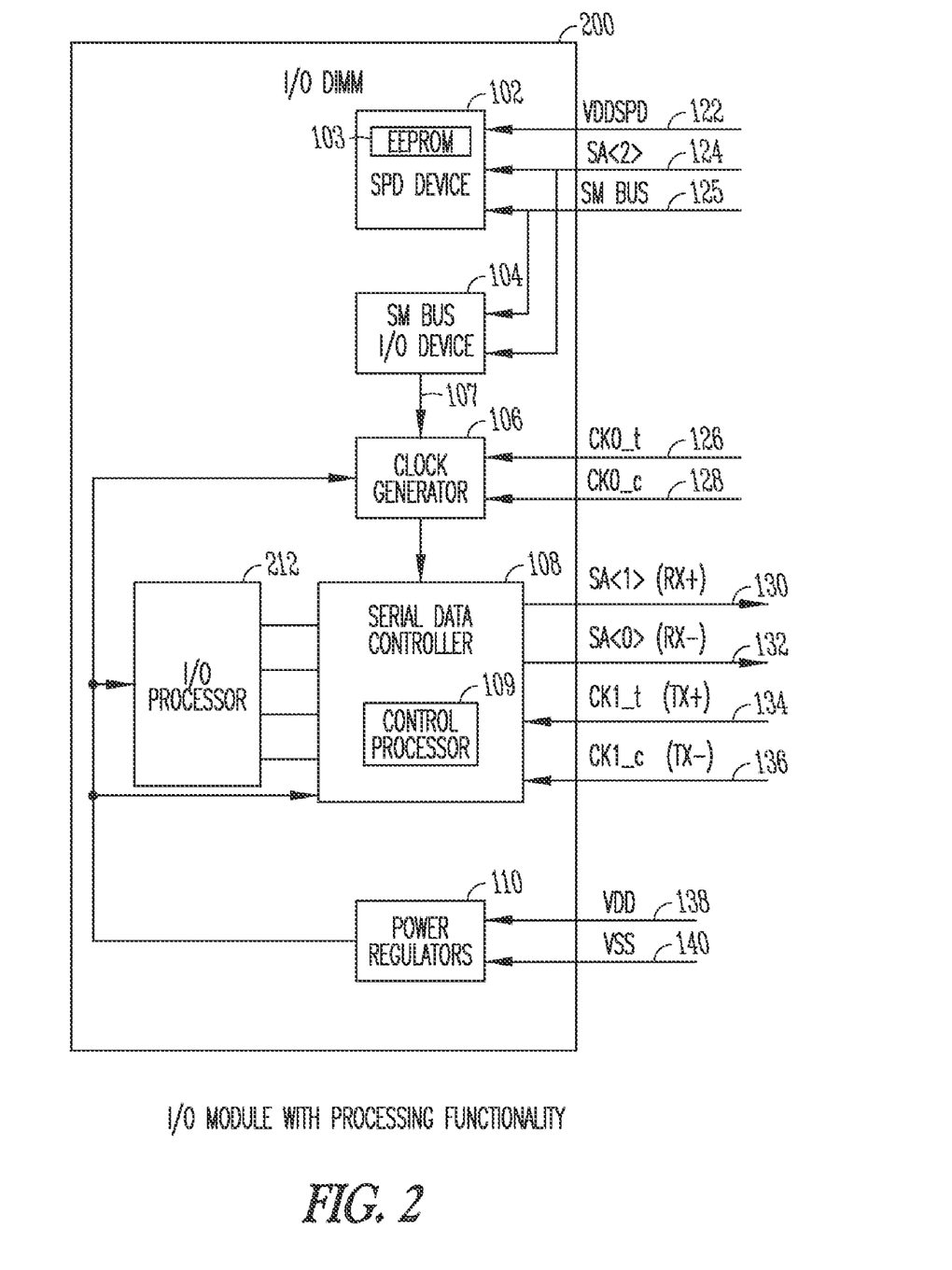
FIG. 2 is a functional block diagram of an I/O module with processing functionality in accordance with some embodiments.

FIG. 2 is a functional block diagram of an I/O module with processing functionality in accordance with some embodiment. In these embodiments, I/O module 200 includes I/O processor 212. When I/O module 200 includes processing functionality, SPD device 102 includes an indication that I/O module 200 includes processing functionality. In these embodiments, I/O processor 212 may include one or more processors configured to process serial data received from the host system through serial data controller 108 and to provide processed serial data to the host system through serial data controller 108. I/O module 200 is similar to I/O module 100 (FIG. 1) except that I/O processor 212 is included in place of flash memory devices 112 (FIG. 1).

In some embodiments, I/O processor 212 may comprise a crypto processor allowing a host system to offload cryptographic processing operations to I/O module 200. In other embodiments, I/O processor 212 may comprise a graphics processor or a graphics accelerator allowing a host system to offload graphics-processing operations to I/O module 200. In other embodiments, I/O processor 212 may include floating point accelerators, and/or general purpose processors. I/O processor 212 may be configured to implement web applications, for example, to improve the performance of the host system. In some of these embodiments, I/O module 200 may also include integrated local memory for the use by I/O processor 212.

In some dual-functionality embodiments, an I/O module may include both I/O functionality, as provided by I/O module 100 (FIG. 1) or I/O module 200 (FIG. 2), and memory functionality as provided by a conventional memory module (e.g., a DIMM). In these embodiments, the memory functionality may include memory that interfaces with a host system over a memory bus. Alternatively, the memory may be dual-ported in which the memory may interface with both the memory bus and through serial data controller 108. These dual-functionality dual-ported embodiments provide a very low latency, high performance sharing of data structures between the I/O processor (i.e., control processor 109) and the processors of the host system.

Figure 3:
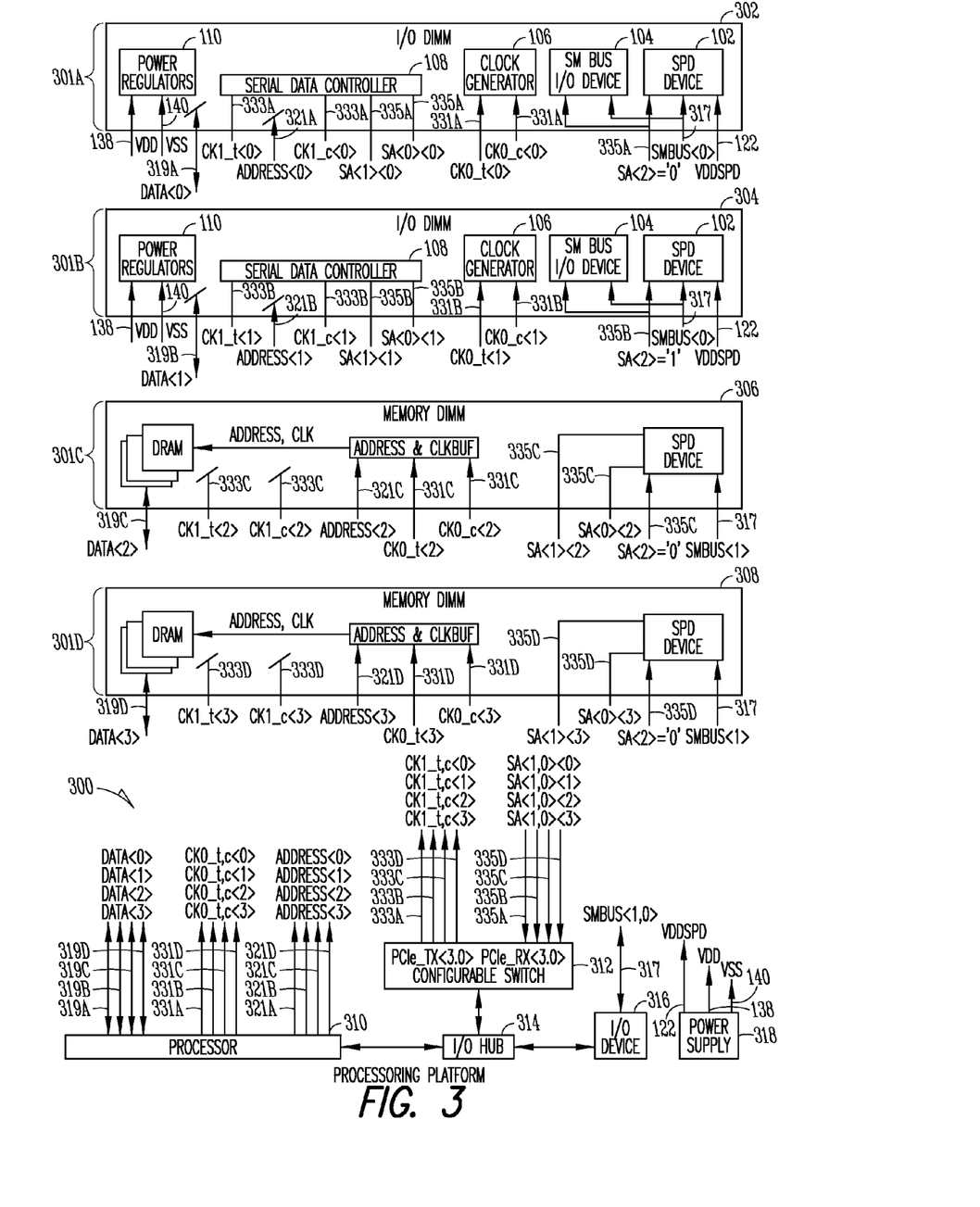
FIG. 3 is a functional block diagram of a processing platform in accordance with some embodiments.

FIG. 3 is a functional block diagram of a processing platform in accordance with some embodiments. Processing platform 300 may serve as a host system for one or more I/O modules, such as I/O module 100 (FIG. 1) and/or I/O module 200 (FIG. 2). Processing platform 300 may also serve as a host system for one or more conventional memory modules. Processing platform 300 may include a plurality of memory module sockets 301A, 301B, 301C and 301D configured to accept both conventional memory modules and I/O modules, such as I/O module 100 (FIG. 1) or I/O module 200 (FIG. 2). The use of one or more I/O modules may increase the I/O functionality of processing platform 300. This is discussed in more detail below.

In some embodiments, memory module sockets 301A, 301B, 301C and 301D may be dual in-line memory module (DIMM) sockets, although the scope of the embodiments are not limited in this respect. When an I/O module, such as I/O module 100 (FIG. 1) or I/O module 200 (FIG. 2), is configured to operate in a DIMM socket, the I/O module may be referred to as an I/O DIMM. A conventional memory module that is configured to operate in a DIMM socket may be referred to as a memory DIMM or a DRAM DIMM. In the example illustrated in FIG. 3, processing platform 300 includes I/O module 302 (a first I/O DIMM) in memory module socket 301A, I/O module 304 (a second I/O DIMM) in memory module socket 301B, memory module 306 (a first memory DIMM) in memory module socket 301C, and memory module 308 (a second memory DIMM) in memory module socket 301D.

Processing platform 300 includes, among other things, processor 310, configurable switch 312, I/O hub 314, I/O device 316, and power supply 318. Processing platform 300 may also include other functional elements associated with conventional processing platforms.

Processing platform 300 may include data lines 319A-D that couple processor 310 with sockets 301A-D. Processor 310 may use one of data lines 319A-D to communicate data with one of the memory modules present in a memory module socket. Data lines 319 are not used for I/O modules present in a memory module socket. For example, data line 319A is unused for I/O module 302 and data line 319B is unused for I/O module 304. On the other hand, data line 319C is used to communicate data with memory module 306 and data line 319D is used to communicate data with memory module 308.

Processing platform 300 may also include system clock signal lines 331A-D to provide system clock signals CK0_t,c. System clock signal lines 331C and 331D may be used by memory modules 306 and 308, respectively, for clocking data with processor 310 over the associated data lines. System clock signal lines 331A and 331B may be used by clock generators 106 of I/O modules 302 and 304 to generate clock signal 107 (FIGS. 1 and 2). System clock signal lines 331A-D may each comprise a differential pair to provide a differential clock signal. System clock signals 126 (CK0_t) and 128 (CK0_c) (FIGS. 1 and 2) may be provided on either system clock signal lines 331A or system clock signal lines 331B to an I/O module.

Processing platform 300 may also include system address lines 321A-D to address memory modules present in sockets 301A-D. System address lines 321 are not used for an I/O module that is present in a memory module socket. For example, system address lines 321A are unused for I/O module 302 and system address lines 321B are unused for I/O module 304. On the other hand, system address lines 321C are used to address memory module 306 and system address lines 321D are used to address memory module 308. Although each of system address lines 321A-D is illustrated as a single line, each may comprise multiple address and control signal lines.

Processing platform 300 may also include clock signal lines 333A-D (CK1_t,c) that couple configurable switch 312 to sockets 301A-D as illustrated. Clock signal lines 333 are not used for memory modules present in sockets, but may be used to communicate serial data for I/O modules present in sockets 301A-D. In the example illustrated in FIG. 3, clock signal lines 333A are used to communicate serial data with I/O module 302 and clock signal lines 333B are used to communicate serial data with I/O module 304. Clock signal lines 333C may remain unused by memory module 306, and clock signal lines 333D may remain unused by memory module 308.

In some embodiments, clock signal lines 333A may operate as TX+ and TX− serial data lines to communicate serial data from configurable switch 312 to I/O module 302. In these embodiments, clock signal lines 333A may comprise a differential pair to communicate digital differential data. In these embodiments, clock signal lines 333A may correspond to clock signal lines 134 and 136 (FIGS. 1 and 2). Clock signal lines 333B may also operate as TX+ and TX− serial data lines to communicate serial data from configurable switch 312 to I/O module 304. In these embodiments, clock signal lines 333B may also comprise a differential pair to communicate digital differential data. In these embodiments, clock signal lines 333B may also correspond to clock signal lines 134 and 136 (FIGS. 1 and 2).

Processing platform 300 may also include SM bus address (SA) lines 335A-D that couple configurable switch 312 to sockets 301A-D as illustrated. SA lines 335A-D are used by configurable switch 312 to address SPD devices 102 of the modules present in sockets 301A-D. Some of SA lines 335 may be used to communicate serial data with I/O modules present in sockets 301A-D. In the example illustrated in FIG. 3, SA lines 335A (SA<1><0> and SA<0><0>) are used to communicate serial data with I/O module 302, and SA lines 335B (SA<1><1> and SA<0><1>) are used to communicate serial data with I/O module 304. SA lines 335A (SA<1><0> and SA<0><0>) may operate as RX+ and RX− serial data lines to communicate serial data to configurable switch 312 from I/O module 302. In these embodiments, SA lines 335A (SA<1><0> and SA<0><0>) may operate as a differential pair to communicate digital differential data. In these embodiments, SA lines 335A (SA<1><0> and SA<0><0>) may correspond to SA lines 130 and 132 (FIGS. 1 and 2). SA lines 335B may also operate as RX+ and RX− serial data lines to communicate serial data to configurable switch 312 from I/O module 304. In these embodiments, SA lines 335B (SA<1><1> and SA<0><1>) may also operate as a differential pair to communicate digital differential data. In these embodiments, SA lines 335B (SA<1><1> and SA<0><1>) may correspond to SA lines 130 and 132 (FIGS. 1 and 2).

Processing platform 300 may also include SM bus 317 to couple I/O device 316 to the modules present in memory module sockets 301A-D. In these embodiments, SM bus 317 provides a low-speed serial management interface into the modules of processing platform 300 that are present in memory module sockets 301A-D. I/O device 316 uses SM bus 317 to determine the types of modules installed in memory module sockets 301A-D based on the indication by SPD device 102 of a module. For example, an SPD device of a memory DIMM may indicate that it is a memory module, while an SPD device of an I/O module may indicate that it is an I/O module. SM bus I/O device 104 of I/O modules 302, 304 may be used configure elements of the I/O module 302, 304 for serial data communication by programming clock generator 106 accordingly.

Memory DIMMs 306, 308, on the other hand, do not require an SM bus I/O device as they do not communicate serial data as an I/O module does. Memory DIMMs 306, 308 may include clock buffers that receive clock signals 331A-D for distributing to other devices on memory DIMMs 306, 308. In some embodiments, memory DIMMs 306, 308 that may be used in memory module sockets 301A-D may comprise random access memory (RAM), such as double-data-rate three (DDR3) synchronous dynamic random access memory (SDRAM).

In some embodiments, I/O device 316 reads the SPD devices of the modules present in memory module sockets 301A-301D to determine whether each module present is an I/O module or a memory module. I/O device 316 may include one or more SM bus controllers (i.e., integrated into I/O device 316) to read SPD devices 102 to determine whether each module is a memory module or an I/O module. For I/O modules, processing platform 300 configures configurable switch 312 to use some of SA lines 335A-D and some of clock signal lines 333A-D as serial data lines for serial data communications with each detected I/O module.

In some embodiments, the SA lines 335A-D selected to be used for serial communication may be configured by configurable switch 312 to communicate serial data using digital differential signals (e.g., RX+ and RX−). Clock signal lines 333A-D selected to be used for serial communication may be configured by configured configurable switch 312 to communicate serial data using digital differential signals (e.g., TX+ and TX−). In some embodiments, the signals communicated between serial data controller 108 and configurable switch 312 may be communicated in accordance with a predetermined communication standard, such as the peripheral component interconnect (PCI) express (PCIe) standard, although the scope of the embodiments is not limited in this respect. In these embodiments, the SA lines used to communicate digital differential signals (e.g., RX+ and RX−) and the clock signal lines used to communicate serial data using digital differential signals (e.g., TX+ and TX−) may be referred to as a single lane (x1) PCIe bus.

In the embodiments illustrated in FIG. 3, data lines 319A-D and address lines 321A-D are used by memory modules 306 and 308, but are not used by I/O modules 302 and 304. In some alternate embodiments, an I/O module, such as I/O module 302 and/or 304 may integrate both I/O functionality and memory functionality and may be referred to as a combo-DIMM. In these embodiments, data lines 319A-D and address lines 321A-D may be used by combo-DIMMs.

SA lines 335A-D are conventionally used to define the SM bus address of each of the module sockets 301A-D. SA lines 335A-D may be directly wired to the address pins of the SPD device on a memory DIMM. In accordance with some embodiments, two of the SA lines (e.g., SA<1><0> and SA<0><0> for I/O module 302 and SA<1><1> and SA<0><1> for I/O module 304) may be used to communicate serial data, and the third SA line (e.g., SA<2>) may be wired to an address pin on the SPD device of the I/O DIMM. The remaining address pins on the SPD device on an I/O DIMM may be wired to '0' (e.g., Vss). In the example, when SA<2> is zero, SPD device 102 of I/O module 302 may be addressed, and when SA<2> is one, SPD device 102 of I/O module 304 may be addressed.

In some embodiments, the third SA line may be hardwired on processing platform 300 to provide either a '0' or a '1' allowing two sockets to share SM bus 317 and allowing the SPD device of a module to be read to determine whether the module is an I/O module or a memory module. For a memory module (e.g., memory module 306 or 308), configurable switch 312 may be disabled during system discovery which may drive the RX+/− signals to '0'. In this situation, memory modules installed in the module sockets will see the corresponding SA address inputs as '0'. After system discovery, processing platform 300 may keep the configurable switch inputs for the memory modules disabled and may enable the inputs for I/O modules. Configurable switch 312 may keep the bus disabled and may program clock generator 106 before enabling the bus.

In some embodiments, serial data controller 108 may be a PCIe controller, and clock generator 106 may be a PCIe clock generator. In these embodiments, configurable switch 312 may be a PCIe configurable switch configured to provide high-bandwidth serial communications with the serial data controller 108 over some of SA lines (e.g., SA lines 335A or 335B) and some of system clock signal lines (e.g., clock signal lines 333A or 333B) in accordance with the PCIe communication standards, although the scope of the embodiments are not limited in this respect as other high-bandwidth serial communication techniques may be used such as the universal-serial bus (USB), the InfiniBand, and the Serial Attached SCSI (SATA) communication techniques.

In some PCIe embodiments, I/O modules 302 and 304 may each use a single lane (x1) PCIe interface. I/O hub 314 provides a four lane (x4), an eight lane (x8) or a sixteen lane (x16) PCIe interface. Configurable switch 312 interfaces the single lane PCIe buses used to communicate with I/O modules 302 and 304 to multiple lane PCIe buses for communication with I/O hub 314. Configurable switch 312 may be configured based on the information read from SPD devices 102. For example, when an SPD device indicates that the associated module installed in one of memory module sockets 301A-D is an I/O module, configurable switch 312 may enable the PCIe bus. When an SPD device indicates that the associated module installed in one of memory module sockets 301A-D is a memory module (e.g., a memory DIMM), then configurable switch 312 may disable the corresponding PCIe bus. In some embodiments I/O hub 314 may be referred to as a Northbridge, and I/O device 316 may be referred to as a Southbridge, although the scope of the embodiments is not limited in this respect.

In some embodiments, clock signal 107 (FIGS. 1 and 2) provided by clock generator 106 may be a differential clock signal and may comprise a PCIe reference clock. In these embodiments, SM bus I/O device 104 programs clock generator 106 based on the particular clock that processing platform 300 is to use for I/O modules 302 and 304. SM bus I/O device 104 may enable processing platform 300 to set one or more configuration pins on clock generator 106 by writing to SM bus I/O device 104 over the SM bus channel 125 (FIGS. 1 and 2).

In PCIe embodiments, PCIe communications may use a reference clock signal of 100 MHz. In these embodiments, clock generator 106 may either self-generate the reference clock signal (i.e., clock signal 107 (FIGS. 1 and 2)) using a local 100 MHz clock generator device or may derive the reference clock signal from some of system clock signals 331A-D (CK0_t,c). In platforms that support spread spectrum clocking, the system clocks may be derived from a common clock source, which may be 133.33 MHz clock signal for a DDR3 based system. In these embodiments, the input clock for memory DIMMs may be a multiple of 133.33 MHz and may be set by the host system based on the type of memory DIMMs it discovers on the memory bus by reading the SPD devices of the modules. Memory DIMMs on a given memory bus may receive the same clock selected to support the slowest memory DIMM on the memory bus. For example, a clock signal of 400 MHz, 533 MHz, 667 MHz, or 800 MHz may be selected and may be a multiple of a 133 MHz clock signal. Deriving a reference clock signal by clock signal generator 106 allows serial data controller 108 on an I/O module, such as I/O module 302 or 304, to participate in the spread-spectrum clocking of host system. In some embodiments, clock signal generator 106 may include a programmable clock generator to participate in system spread spectrum clocking. In these embodiments, an I/O module, such as I/O module 302 or I/O module 304, may be configured to allow processing platform 300 to program clock generator 106 using SM bus channel 317 implemented using SM bus I/O device 104. In these embodiments, processing platform 300 may set configuration pins on clock generator 106 by writing to SM bus I/O device 104 over the SM bus channel 317.

In some alternate embodiments, clock generator 106 may self-generate reference clock signal 107 (FIGS. 1 and 2) using internal circuitry on the I/O module. For PCIe embodiments, clock generator 106 may include a local 100 MHz clock signal generation circuit.

In some embodiments, control software may be downloaded into I/O modules 302 and/or 304 for performing serial data communications. In these embodiments, the control software may be downloaded during configuration of I/O modules 302 and/or 304.

Figure 4:
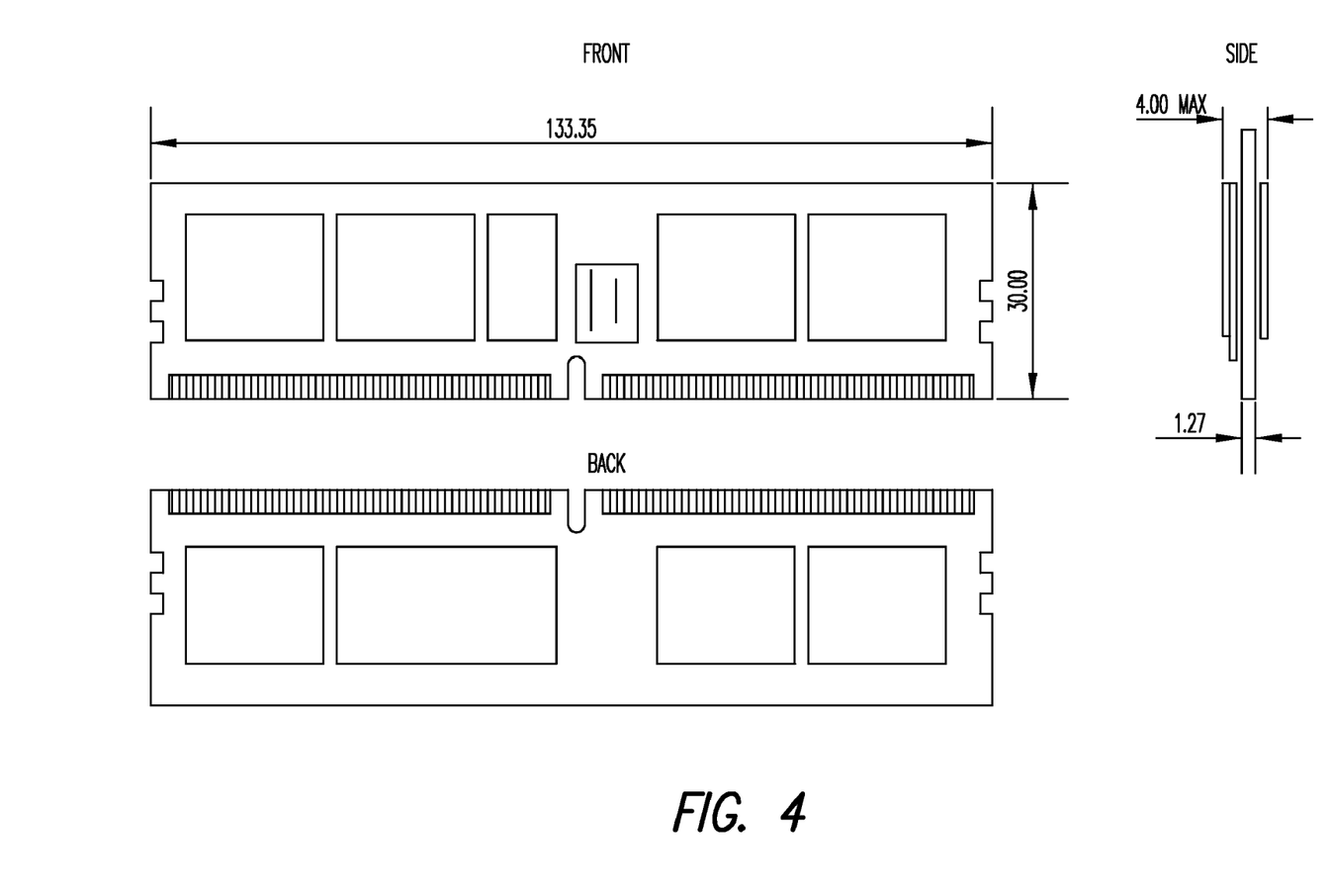
FIG. 4 illustrates a physical outline of an I/O module in accordance with some I/O DIMM embodiments.

FIG. 4 illustrates a physical outline of an I/O module in accordance with some I/O DIMM embodiments. The physical outline illustrated in FIG. 4 may be suitable for use as I/O module 100 (FIG. 1) or I/O module 200 (FIG. 2) and may allow I/O module 100 (FIG. 1) or I/O module 200 (FIG. 2) to operate in a conventional DIMM socket, such as memory module sockets 301A-D. The dimensions shown in FIG. 4 are in millimeters.

Although I/O module 100 (FIG. 1) and I/O module 200 (FIG. 2) are illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs) and combinations of various hardware and logic circuitry for performing at least the functions described herein. In some embodiments, the functional elements may refer to one or more processes operating on one or more processing elements.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or nonvolatile memory or a combination thereof.

Embodiments may be implemented in one or a combination of hardware, firmware and software. Embodiments may also be implemented as instructions stored on a computer-readable medium, which may be read and executed by at least one processor to perform the operations described herein. A computer-readable medium may include any mechanism for storing or transmitting information in a form readable by a machine (e.g., a computer). For example, a computer-readable medium may include read-only memory (ROM), random-access memory (RAM), magnetic disk storage media, optical storage media, flash-memory devices, and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An input-output (I/O) module configured to operate in a memory module socket, the I/O module comprising:
   a serial-presence detection (SPD) device to indicate that the I/O module is an I/O device and to indicate one or more functions associated with the I/O module; and
   a peripheral component interconnect express (PCIe) serial data controller to communicate serial data with a configurable PCIe switch of a host system over preselected system management (SM) bus address lines and unused system clock signal lines of the memory module socket,
   wherein the configurable PCIe switch provides high-bandwidth serial communications with the PCIe serial data controller over the preselected SM bus address lines and the unused system clock signal lines in accordance with a PCIe communication technique.

2. The I/O module of claim 1 wherein the preselected SM bus address lines and the unused system clock signal lines are configured by the configurable switch to operate as serial data lines in accordance with the PCIe communication technique.

3. The I/O module of claim 2 further comprising:
   a clock generator to provide a clock signal to the serial data controller for use in communicating the serial data; and
   an SM bus I/O device to interface with an SM bus channel of the host system to configure the clock generator for serial data communication.

4. The I/O module of claim 3 wherein the host system is configured to program the clock generator over the SM bus channel when the I/O module is identified as an I/O device, and
   wherein the clock generator either:
   self-generates the clock signal using internal circuitry on the I/O module, or
   derives the clock signal from system clock signals provided within the memory module socket.

5. The I/O module of claim 1 wherein the host system reads the SPD device over an SM bus channel and configures the configurable PCIe switch to use the preselected SM bus address lines and the unused system clock signal lines as serial data lines when the SPD device indicates that the I/O module located in the memory module socket is identified as an I/O device rather than a memory device.

6. The I/O module of claim 5 wherein the one or more functions provided by the I/O module include at least one of either information storage or information processing functionality,
   wherein when the SPD device includes an indication that the I/O module includes information storage functionality, the I/O module further comprises one or more flash memory devices configured to store serial data received through the serial data controller, and
   wherein when the SPD device includes an indication that the I/O module includes information processing functionality, the I/O module further comprises one or more processors configured to process serial data received from the serial data controller.

7. An input-output (I/O) module configured to operate in a memory module socket, the I/O module comprising:
   a serial-presence detection (SPD) device to indicate that the I/O module is an I/O device and to indicate one or more functions associated with the I/O module; and
   a serial data controller to communicate serial data in accordance with a predetermined communication technique with a configurable switch of a host system over preselected system management (SM) bus address lines and unused system clock signal lines of the memory module socket,
   wherein the configurable switch provides high-bandwidth serial communications with the serial data controller over the preselected SM bus address lines and the unused system clock signal lines in accordance with the predetermined communication technique, and
   wherein the predetermined communication technique comprises one of a Serial Advanced SCSI, SATA, a universal-serial bus (USB) or a switched-fabric (Infini-Band) communication technique.

8. The I/O module of claim 7 wherein the preselected SM bus address lines and the unused system clock signal lines are configured by the configurable switch to operate as serial data lines in accordance with the predetermined communication technique.

9. The I/O module of claim 8 further comprising:
   a clock generator to provide a clock signal to the serial data controller for use in communicating the serial data; and
   an SM bus I/O device to interface with an SM bus channel of the host system to configure the clock generator for serial data communication.

10. The I/O module of claim 9 wherein the host system is configured to program the clock generator over the SM bus channel when the I/O module is identified as an I/O device, and
    wherein the clock generator either:
    self-generates the clock signal using internal circuitry on the I/O module, or
    derives the clock signal from system clock signals provided within the memory module socket.

11. The I/O module of claim 7 wherein the host system reads the SPD device over an SM bus channel and configures the configurable switch to use the preselected SM bus address lines and the unused system clock signal lines as serial data lines when the SPD device indicates that the I/O module located in the memory module socket is identified as an I/O device rather than a memory device.

12. The I/O module of claim 11 wherein the one or more functions provided by the I/O module include at least one of either information storage or information processing functionality,
    wherein when the SPD device includes an indication that the I/O module includes information storage functionality, the I/O module further comprises one or more flash memory devices configured to store serial data received through the serial data controller, and
    wherein when the SPD device includes an indication that the I/O module includes information processing functionality, the I/O module further comprises one or more processors configured to process serial data received from the serial data controller.

13. A method for operating an input-output (I/O) module in a memory module socket, the method comprising:
    indicating to a host system with a serial-presence detection (SPD) device, that the I/O module is an I/O device and to indicate one or more functions associated with the I/O module;
    communicating, with a serial data controller, serial data in accordance with a predetermined communication technique with a configurable switch of a host system over preselected system management (SM) bus address lines and unused system clock signal lines of the memory module socket; and wherein the predetermined communication technique comprises one of a peripheral component interconnect express (PCIe), a Serial Advanced SCSI, SATA, a universal-serial bus (USB) or a switched-fabric (Infini-Band) communication technique.

14. The method of claim 13 wherein the preselected SM bus address lines and the unused system clock signal lines are configured by the configurable switch to operate as serial data lines in accordance with the predetermined communication technique.

15. The method of claim 14 further comprising:
configuring a clock generator of the I/O module to provide a clock signal to the serial data controller for use in communicating the serial data; and
interfacing with an SM bus I/O device of the I/O module with an SM bus channel of the host system to configure the clock generator for serial data communication.

16. The method of claim 15 wherein the host system is configured to program the clock generator over the SM bus channel when the I/O module is identified as an I/O device, and
wherein the method further comprises the clock generator either:
self-generating the clock signal using internal circuitry on the I/O module, or
deriving the clock signal from system clock signals provided within the memory module socket.

17. The method of claim 13 wherein the host system is configured to read the SPD device over an SM bus channel and configures the configurable switch to use the preselected SM bus address lines and the unused system clock signal lines as serial data lines when the SPD device indicates that the I/O module located in the memory module socket is identified as an I/O device rather than a memory device.

18. The method of claim 17 wherein the one or more functions provided by the I/O module include at least one of either information storage or information processing functionality,
wherein when the SPD device includes an indication that the I/O module includes information storage functionality, the method comprises storing serial data received through the serial data controller, and
wherein when the SPD device includes an indication that the I/O module includes information processing functionality, the method further comprises processing serial data received from the serial data controller.

* * * * *